United States Patent
Landeros

(10) Patent No.: US 6,828,215 B2
(45) Date of Patent: Dec. 7, 2004

(54) DEVICE AND METHOD FOR CORE BUILDUP USING A SEPARATOR

(75) Inventor: Juan Landeros, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/388,519

(22) Filed: Mar. 17, 2003

(65) Prior Publication Data

US 2003/0168177 A1 Sep. 11, 2003

Related U.S. Application Data

(62) Division of application No. 10/046,231, filed on Jan. 16, 2002, now Pat. No. 6,555,444.

(51) Int. Cl.$^7$ .......................... H01L 21/30; H01L 21/46
(52) U.S. Cl. ....................................................... 438/455
(58) Field of Search ................................ 438/455, 457, 438/458; 174/260; 361/760

(56) References Cited

U.S. PATENT DOCUMENTS 5,780,311 A  7/1998  Beasom et al.

Primary Examiner—David A. Zarneke
(74) Attorney, Agent, or Firm—Schwegman, Lundberg, Woessner & Kluth, P.A.

(57) ABSTRACT

A device and method to manufacture two substrates simultaneously using a separator. The separator is sandwiched between two cores and adhesive is used to affix to the first core to the second core. Layers are affixed to the first core and the second core simultaneously. The cores are then separated and the separator removed to form two substrates.

33 Claims, 4 Drawing Sheets

DEVICE AND METHOD FOR CORE BUILDUP USING A SEPARATOR

CROSS-REFERENCE TO RELATED APPLICATION

This application is a divisional of U.S. Ser. No. 10/046,231 filed 16 Jan. 2002, now issued as U.S. Pat. No. 6,555,444.

FIELD

The invention relates to a device and method for core buildup using a separator. More particularly, the present invention is a device and method for dual substrate fabrication based on simultaneous core buildup using a separator.

BACKGROUND

In the rapid development of industrial automation great progress has been made in the mass production of products. The need for advancement in industrial automation is evident in every industry, but even more so in an industry such as chip or processor manufacturing in which competition and fluctuating demand causes prices to remain constant or even decline. Therefore, improvements in the process for manufacturing of a package, as illustrated in FIG. 1, to reduce cost is perpetually required, comprises a die 20 which may be a processor or other chip, an integrated heat spreader 30, an heat sink 40, a substrate 10, and a number of pins 50. It should be understood that the package illustrated in FIG. 1 is provided simply as an example and not intended to illustrate all the components in a package. The package would be installed on a printed circuit board such as, but not limited to, a baseboard by inserting the pins 50 into a slot (not shown). The die 20 would communicate to the printed board via substrate 10 and pins 50.

Outside of the die 20, the substrate 10 would often be the most complex item within a package and comprise a printed circuit in itself. Therefore, any method that would reduce the cost to manufacture the substrate 10 even slightly would improve profitability for the manufacturer since these units would be manufactured in large quantities.

Therefore, a device and method for manufacturing a substrate 10 is required, and that will reduce the time and cost of manufacturing, thereby improving the profitability for the entire package.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written with and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
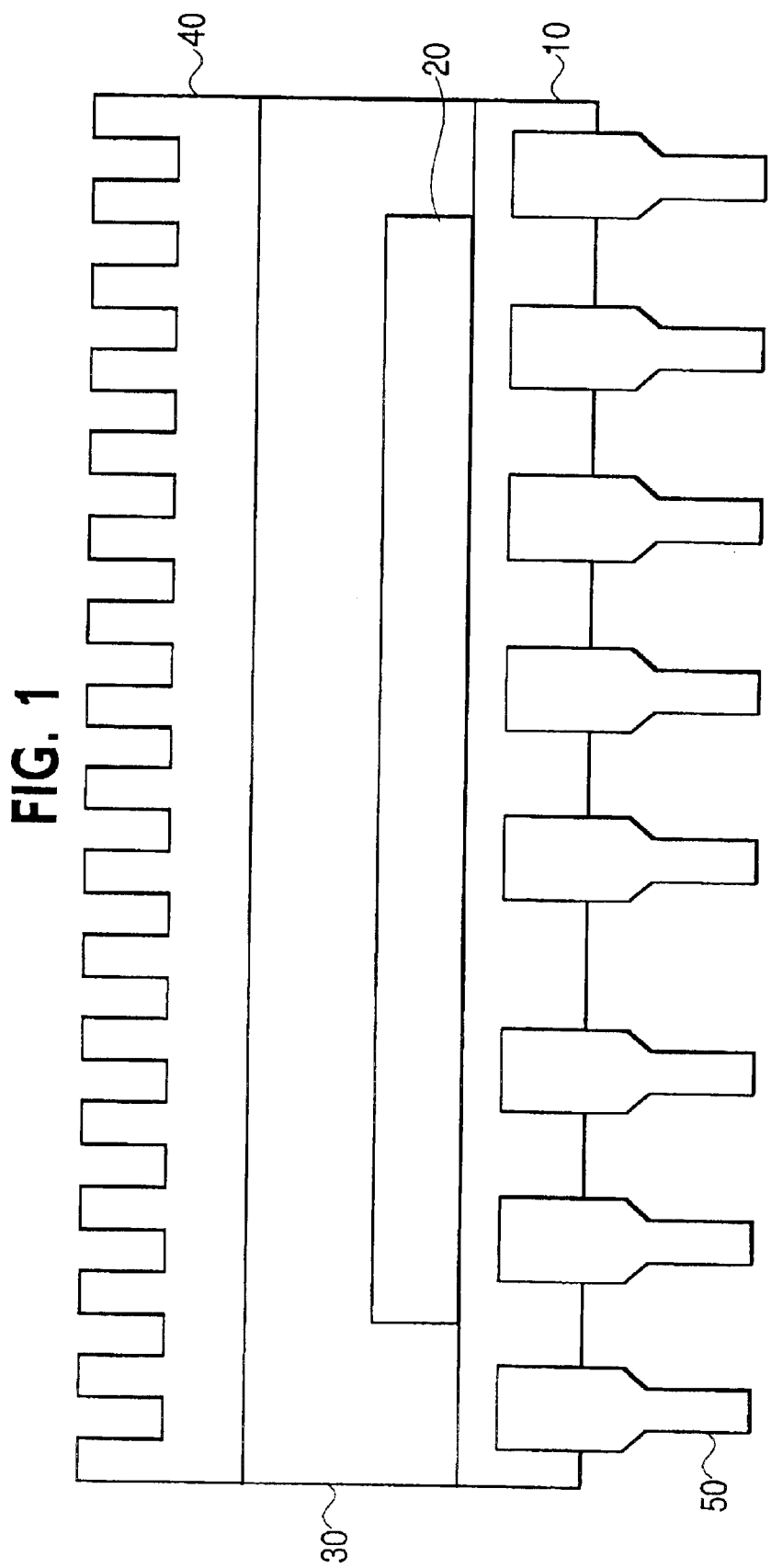
FIG. 1 is a side view of an example package.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the figures for simplicity of illustration and discussion, and so as not to obscure the invention.

Figure 2:
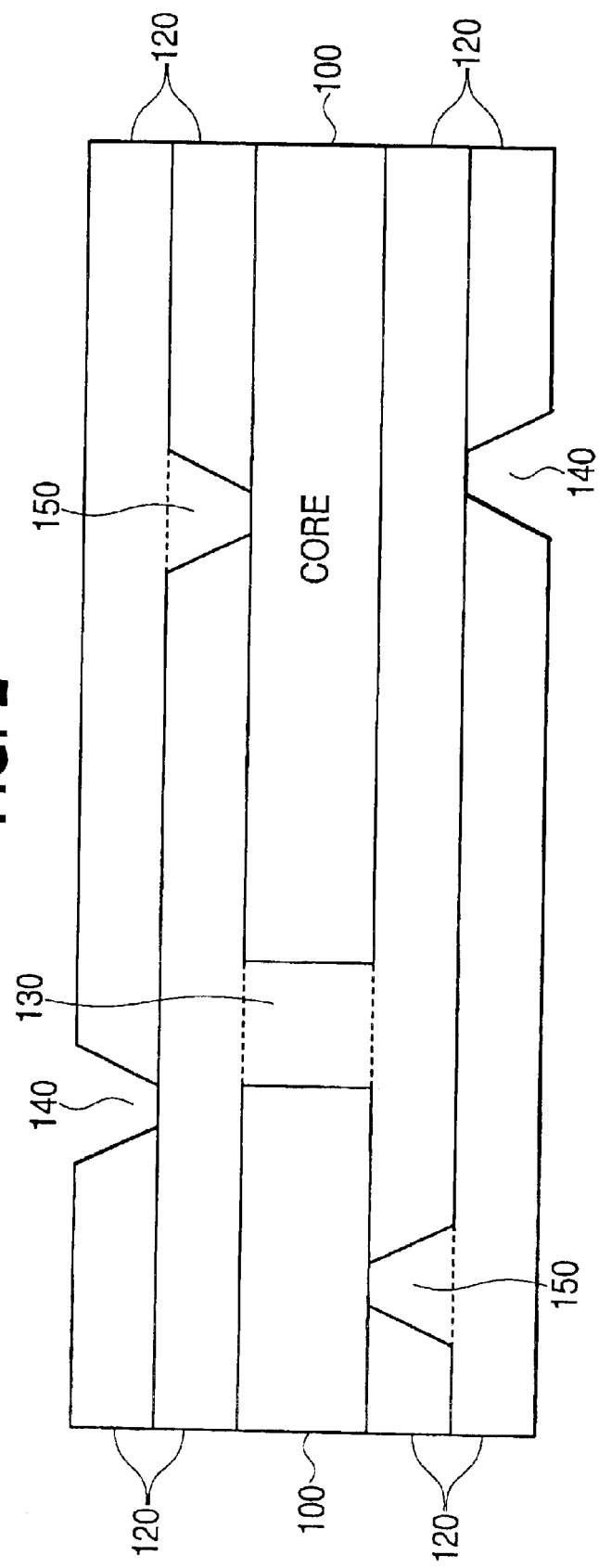
FIG. 2 is a side view of an example substrate.

FIG. 2 is a side view of an example substrate 10. Substrate 10 may be a small multilayered printed circuit board in which a core 100 forms the base of the unit on which other layers are placed. The core 100 may be manufactured from a nonconductive material such as glass epoxy fiber. The core 100 may have one or more through hole 130 placed therein in order to provide power or established communications to other layers within the substrate 10. Layers 120 may be placed on core 100 utilizing any of a number of well-known techniques including, and not limited to, spinning, sputtering metal layers thereon utilizing a mask and/or a positive or negative resist layer which may be removed for a chemical process. Through holes 140 and 150 may be ablated and formed utilizing a laser or other well-known method for establishing communications and/or provide power to the other layers 120. Through holes 140 and 150 need not pass through more than one layer 120 or any fixed number of layers 120. In order to reduce the time required to manufacture a substrate two layers 120 on opposite sides of the core 100 may be placed on the substrate 10 at the same time. Therefore, the time required to manufacture a single substrate 10 may be reduced by simultaneously placing layers 120 on opposite sides of the core 100.

Figure 3:
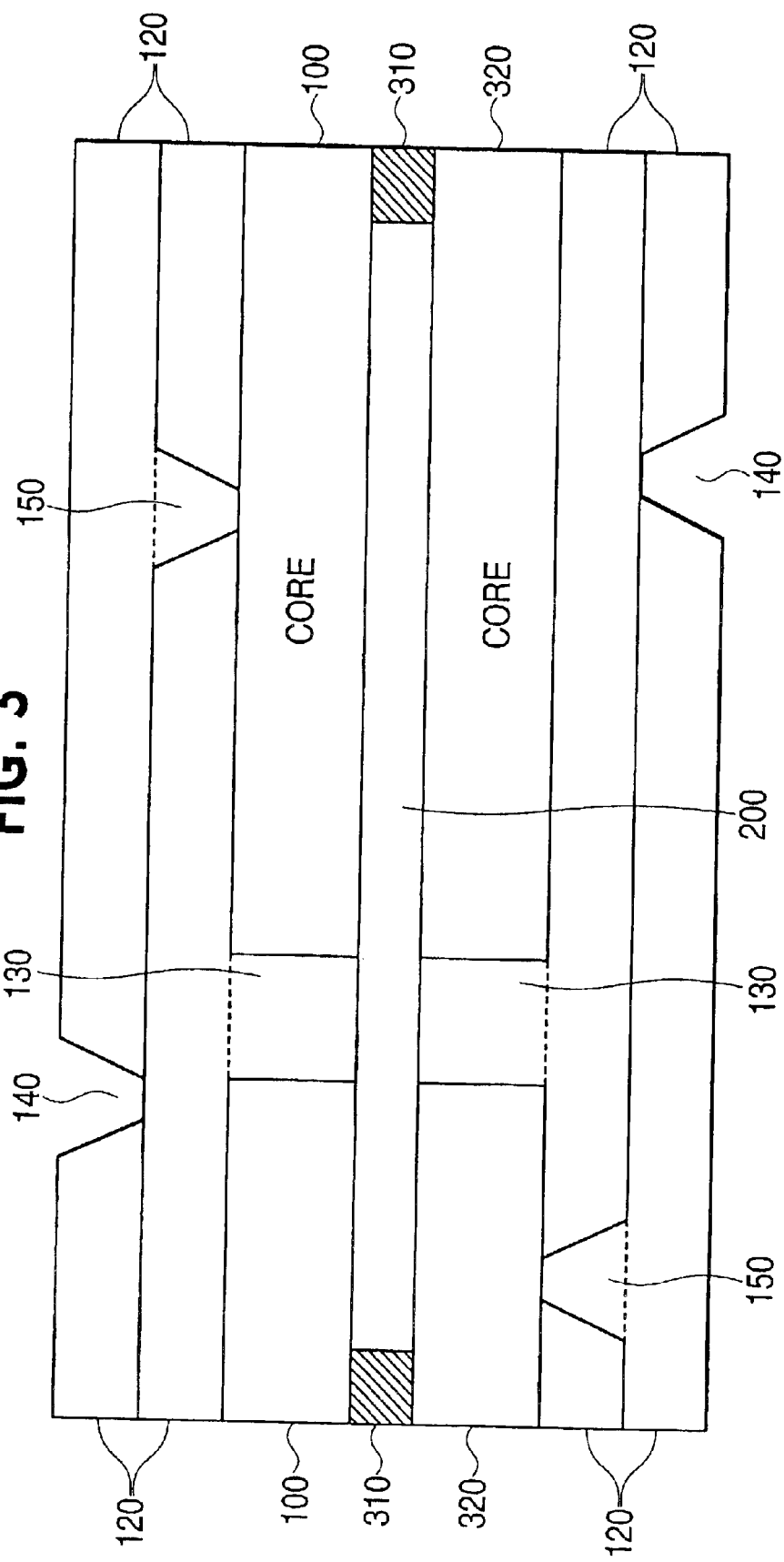
FIG. 3 is a side view of two substrates as manufactured in an example embodiment of the present invention.

FIG. 3 is a side view of two substrates 10 as manufactured in an example embodiment of the present invention. The process for the manufacture for the two substrates 10 shown in FIG. 3 is described in further detail in reference to FIG. 4, Each substrate 10 has its own core 100 and 320 that form the base for a separate and possibly different or identical substrate 10. These cores 100 and 320 may also be referred to as a first core and second core, respectively. Cores 100 and 320 are attached to one another utilizing adhesive 310, which is positioned at opposite ends or around the exterior parameter of cores 100 and 320. In addition to the adhesive placed around the parameter or opposite ends of cores 100 and 320, a separator 200 is placed in between the two cores 100 and 320 in order to maintain rigidity of the two cores 100 and 320 during the manufacturing process in which layers 120 are simultaneously placed on opposite sides simultaneously of the two cores 100 and 320 as previously discussed in reference to FIG. 2. The separator 200 may be composed of a Teflon® like or other suitable material so as to facilitate its removal from between the two cores 100 and 320 once all layers 120 of each substrate 10 have been generated. The process for placing layers 120 onto cores 100 and 320 remains unchanged from that previously discussed in reference to FIG. 2. Through holes 130 would be created where required for cores 100 and 320 using any well-known techniques including, but not limited to, laser ablation. These through holes 130 would be utilized for supply power or communications to other layers 120. Cores 100 and 320 may be composed of a glass epoxy resin material. Each layer 120 would simultaneously be placed on each core 100 and 320. Through holes 140 and 150 may be placed in a layer 120 utilizing any well-known techniques such as, but not limited to, laser ablation. Once all layers of the two substrates 10 have been placed and cured, then the two substrates may be separated for mounting into package as exemplified by that shown in FIG. 1. It should be noted that the separation of cores 100 and 320 may be accomplished through any well-known means including, but not limited to, dissolving the adhesive 310 using a chemical wash. The separator 200 may then be removed for cleaning and reutilization in the manufacture of another two substrates 10.

Figure 4:
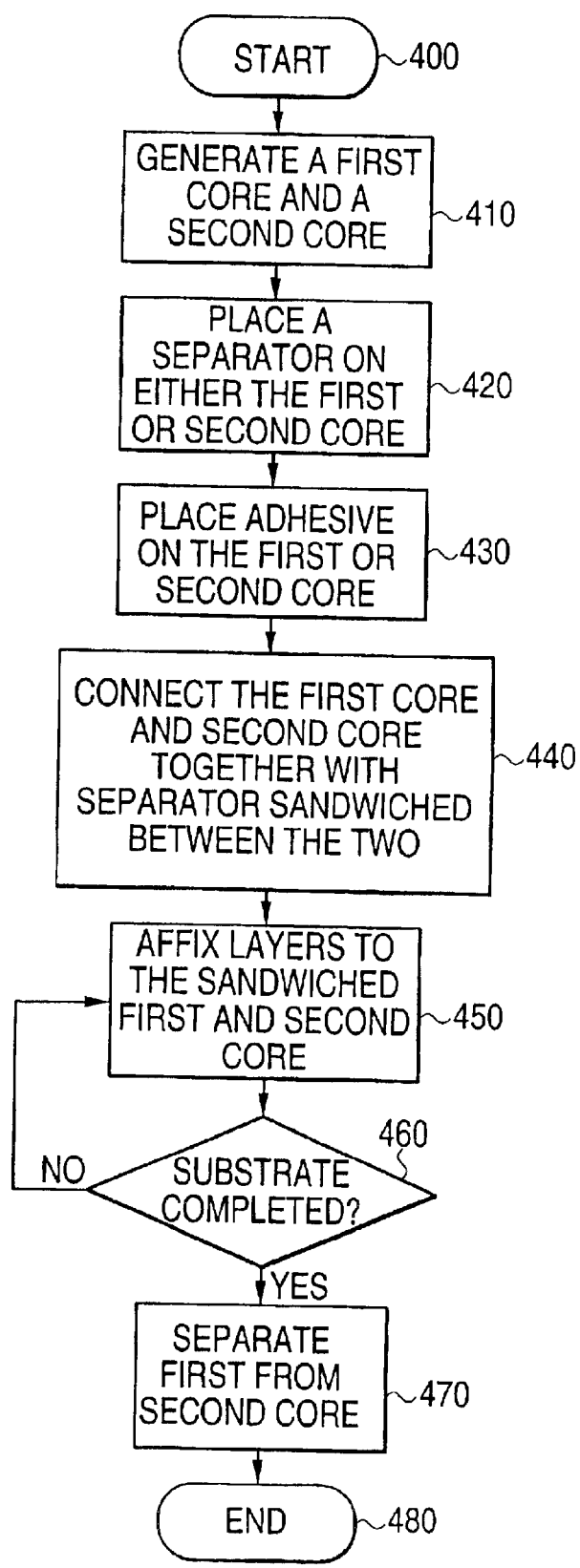
FIG. 4 is a flowchart of the manufacturing process used to create the substrate illustrated in FIG. 3 in an example embodiment of the present invention.

FIG. 4 is a flowchart of the manufacturing process used to create the substrate 10 illustrated in FIG. 3 in an example embodiment of the present invention. The process begins in operation 400 and immediately proceeds to operation 410. In operation 410 a first core and a second core is generated. It may be necessary in this operation to generate through holes 130 as illustrated in FIG. 3 or this may optionally be done at operation 440, as discussed ahead. Once the two cores are prepared then processing proceeds to operation 420. In operation 420 a separator 200 is placed between the first and second core. The separator 200 may be composed of a Teflon® like or other suitable material that would facilitate its removal in operation 470. Adhesive 310 is then placed around the parameter or outer edges of the first and second core in operation 430. Thereafter, in operation 440 the first and second core are attached to one another utilizing the adhesive 310 and with the separator 200 sandwiched between the first and second core. In operation 450, layers 120 are simultaneously placed on the first and second core as previously discussed in reference to FIG. 2. Thereafter, in operation 460 it is determined if the substrates 10 have been completed. If all the layers 120 have not been placed on the first core and second core with through holes 140 and 150 placed therein, then processing returns to Operation 450 for repetition. However, if all layers 120 have been placed on the first and second core then processing proceeds to operation 470. In operation 470, the first and second cores are separated from each other. This would involve the removal of adhesive 310 through some well-known mechanism. Once the adhesive 310 was removed then the separator 200 would be removed for possible cleaning and reuse. Thereafter, processing proceeds to operation 480 where processing terminates.

The benefits resulting from the present invention is that a device and method of generating two substrates used in two separate packages is disclosed that reduces the time and cost of creating a substrate. Further, requiring additional layers to form an even number of layers is not needed since the embodiments of the present invention may support an odd number of layers.

While we have shown and described only a few examples herein, it is understood that numerous changes and modifications as known to those skilled in the art could be made to the example embodiment of the present invention. Therefore, we do not wish to be limited to the details shown and described herein, but intend to cover all such changes and modifications as are encompassed by the scope of the appended claims.

What is claimed is:

1. A device for manufacturing two substrates together, comprising:
   a first core;
   a separator; and,
   a second core attached with adhesive to the first core with the separator sandwiched between the first core and the second core.

2. The device recited in claim 1, comprising:
   a plurality of layers attached to the first and second core, wherein at least ones of the plurality of layers are simultaneously formed layers.

3. The device recited in claim 2, wherein the adhesive and separator are removable so that the first core forms a first substrate with at least one layer attached to the first core, and the second core forms a second substrate with at least one layer attached to the second core.

4. The device recited in claim 1, where the separator is disposed in a central region of the first core and the second core.

5. The device recited in claim 4, where the separator is substantially centered with respect to the first core and the second core.

6. The device recited in claim 1, where the separator is made at least partially of a non-stick material.

7. The device recited in claim 6, where the separator is made at least partially of a Teflon material.

8. The device recited in claim 2, where layers of the plurality of layers are provided only on a single side of each of the first and second core, to provide single-sided-built-up cores.

9. The device recited in claim 1, where each of the first and second core with layers attached, is a multi-layered printed circuit board (PCB).

10. The device recited in claim 1, where the separator provides a predetermined level of rigidity to the first and second core to facilitate rigidity thereof during a manufacturing process.

11. The device recited in claim 1, where the adhesive is provided at an entirety of outer edges of at least one of the first and second core.

12. A substrate manufacturing facility comprising:
   a plurality of two-substrate devices, each including:
      a first core;
      a separator; and,
      a second core attached with adhesive to the first core with the separator sandwiched between the first core and the second core.

13. The facility recited in claim 12, comprising:
   a plurality of layers attached to the first and second core, wherein at least ones of the plurality of layers are simultaneously formed layers.

14. The facility recited in claim 13, wherein the adhesive and separator are removable so that the first core forms a first substrate with at least one layer attached to the first core, and the second core forms a second substrate with at least one layer attached to the second core.

15. The facility recited in claim 12, where the separator is disposed in a central region of the first core and the second core.

16. The facility recited in claim 15, where the separator is substantially centered with respect to the first core and the second core.

17. The facility recited in claim 12, where the separator is made at least partially of a non-stick material.

18. The facility recited in claim 12, where the separator is made at least partially of a Teflon material.

19. The facility recited in claim 13, where layers of the plurality of layers are provided only on a single side of each of the first and second core, to provide single-sided-built-up cores.

20. The facility recited in claim 12, where each of the first and second core with layers attached, is a multi-layered printed circuit board (PCB).

21. The facility recited in claim 12, where the separator provides a predetermined level of rigidity to the first and second core to facilitate rigidity thereof during a manufacturing process.

22. The facility recited in claim 12, where the adhesive is provided at an entirety of outer edges of at least one of the first and second core.

23. A substrate inventory comprising:
  a plurality of two-substrate devices, each including:
    a first core;
    a separator; and,
    a second core attached with adhesive to the first core with the separator sandwiched between the first core and the second core.

24. The inventory recited in claim 23, comprising:
  a plurality of layers attached to the first and second core, wherein at least ones of the plurality of layers are simultaneously formed layers.

25. The inventory recited in claim 24, wherein the adhesive and separator are removable so that the first core forms a first substrate with at least one layer attached to the first core, and the second core forms a second substrate with at least one layer attached to the second core.

26. The inventory recited in claim 23, where the separator is disposed in a central region of the first core and the second core.

27. The inventory recited in claim 26, where the separator is substantially centered with respect to the first core and the second core.

28. The inventory recited in claim 23, where the separator is made at least partially of a non-stick material.

29. The inventory recited in claim 28, where the separator is made at least partially of a Teflon material.

30. The inventory recited in claim 24, where layers of the plurality of layers are provided only on a single side of each of the first and second core, to provide single-sided-built-up cores.

31. The inventory recited in claim 23, where each of the first and second core with layers attached, is a multi-layered printed circuit board (PCB).

32. The inventory recited in claim 23, where the separator provides a predetermined level of rigidity to the first and second core to facilitate rigidity thereof during a manufacturing process.

33. The inventory recited in claim 23, where the adhesive is provided at an entirety of outer edges of at least one of the first and second core.

* * * * *